United States Patent [19]

Tabuchi

[11] Patent Number: 5,623,167
[45] Date of Patent: Apr. 22, 1997

[54] SEMICONDUCTOR DEVICE

[75] Inventor: Toshihiro Tabuchi, Hiratsuka, Japan

[73] Assignee: Kabushiki Kaisha Komatsu Seisakusho, Japan

[21] Appl. No.: 356,389

[22] PCT Filed: Jun. 22, 1993

[86] PCT No.: PCT/JP93/00839

§ 371 Date: Dec. 19, 1994

§ 102(e) Date: Dec. 19, 1994

[87] PCT Pub. No.: WO94/00880

PCT Pub. Date: Jan. 6, 1994

[30] Foreign Application Priority Data

Jun. 24, 1992 [JP] Japan .................... 4-043893

[51] Int. Cl.⁶ ............................... H01L 23/29
[52] U.S. Cl. .................. 257/794; 257/688; 257/689
[58] Field of Search ............................ 257/688, 689, 257/696, 794

[56] References Cited

U.S. PATENT DOCUMENTS

| | | | |
|---|---|---|---|
| 3,200,310 | 8/1965 | Carman | 257/794 |
| 3,375,417 | 3/1968 | Hull | 257/794 |
| 3,533,832 | 10/1970 | Volder | 257/794 |
| 3,844,029 | 10/1974 | Dibugnara . | |
| 4,042,951 | 8/1977 | Robinson et al. | 257/794 |

FOREIGN PATENT DOCUMENTS

| | | |
|---|---|---|
| 1491 | 1/1948 | Japan . |
| 12332 | 7/1958 | Japan . |
| 36-12332 | 7/1958 | Japan . |
| 22388 | 5/1973 | Japan . |
| 48-22388 | 5/1973 | Japan . |
| 98180 | 9/1974 | Japan . |

OTHER PUBLICATIONS

International Search Report.
International Preliminary Examination Report.

*Primary Examiner*—Mahshid D. Saadat
*Assistant Examiner*—S. V. Clark
*Attorney, Agent, or Firm*—Greer, Burns & Crain, Ltd.

[57] ABSTRACT

This invention aims at providing a glass package type capacitive element having a high reliability and a high resistance to heat and mechanical impact. In the glass package, a semiconductor device (2) is connected with a lead (5) through a conductor (8) having a bent structure.

8 Claims, 3 Drawing Sheets

SEMICONDUCTOR DEVICE

TECHNICAL FIELD

The present invention relates to a semiconductor device and more particularly, to a structure of a glass seal type capacitive device.

BACKGROUND ART

There is known a conventional glass package type capacitive device in which a dielectric film is formed on a surface of a silicon substrate to form a capacitive element and the capacitive element is sealed within a glass container (refer to a Japanese Patent Publication No. 57-26432). This type of capacitive devices have been widely used because the element can be easily made in a microminiaturized form at a high production speed and also can have characteristic values conforming to design values.

In this capacitive device, as shown in FIG. 3, a capacitive element 2 formed of a silicon chip is sealed within a cylindrical glass container 1 and leads 5 and 6 are led out from electrodes 3a and 3b of the capacitive element 2 through solder layers 4a and 4b respectively. Reference numerals 7a and 7b denote a silicon nitride film and a silicon oxide film formed on a surface of a silicon substrate to form a dielectric film by this two-layered film. The electrode 3a is disposed on this dielectric film.

In such a capacitive device, the dielectric film formed on the silicon substrate is as thin as at most several μm. However, when it is desired to obtain a large capacitance, the thin film is sometimes formed to have a thickness of about 10 nm. In the latter case, there is a problem that the device becomes weak when subjected to an external stress.

Further, since a high temperature of 600°–800° C. is required for the glass sealing, when returned to a room temperature, thermal stresses within the glass container cannot escape from inside of the glass container to outside, which means that a stress caused by a difference in expansion coefficients is applied directly to the dielectric film. For this reason, with respect to relatively soft films having a low denseness, that is, insulating films such as silicon oxide films or titanium oxide films formed by a liquid phase growth technique, insulating films formed by a physical vapor phase growth process as a sputtering process or an electron beam vapor deposition process, or insulating films (spin-on glass) made from an alcoholic solution of silanol as its major material, it is highly difficult to assemble or fabricate such a film by a conventional sealing method while maintaining its normal characteristics. Even such a film that is considered to be relatively soft and resistive to stress as a silicon oxide film formed by a thermal oxidation method, a silicon nitride film formed by a plasma chemical vapor deposition (CVD) process, or a composite film thereof, has a problem that such a film, in many cases, tends to be destroyed or deteriorated in its characteristics by thermal stress during its fabrication.

Further, even when such a film is successfully fabricated into its normal state, there is a problem that the film is susceptible to a drop shock or a thermal shock caused at the time of soldering the element to a circuit substrate.

DISCLOSURE OF THE INVENTION

As described above, the prior art glass package type capacitive device has been defective in that thermal stress cannot escape from inside the glass container and the stress caused by the expansion coefficient difference is applied directly to the dielectric film, resulting in deterioration of its characteristics. In addition, the prior art device has such a problem that the dielectric film is susceptible to a stress caused by a mechanical shock such as a drop and thus liable to be destroyed.

In view of the above circumstances, it is an object of the present invention to provide a glass package type capacitive device which is highly resistive to thermal and mechanical shocks and highly reliable.

In accordance with an aspect of a semiconductor device of the present invention, leads for external connection and a semiconductor element are connected through a conductor having a bent structure or an elastic member within a glass container.

More specifically, there is provided a semiconductor device which comprises a cylindrical glass container, a semiconductor chip sealedly provided within the glass container and forming a capacitive element of an MIS structure, first and second electrodes formed to cover substantially all areas of front and rear surfaces of the semiconductor chip, a first lead one end of which is sealedly disposed within the glass container to be connected to the first electrode and the other end of which is led out from the glass container, a second lead having a bent portion and sealedly disposed within the glass container to be connected to the second electrode at one end thereof, and a third lead one end of which is sealedly disposed within the glass container to be connected to the second lead and the other end of which is led out from the glass container.

In accordance with another aspect of the present invention, there is provided a semiconductor device which comprises a cylindrical glass container, a semiconductor chip sealedly provided within the glass container and forming a capacitive element of an MIS structure, first and second electrodes formed to cover substantially all areas of front and rear surfaces of the semiconductor chip, a first lead one end of which is sealedly disposed within the glass container to be connected to the first electrode and the other end of which is led out from the glass container, a second extensible lead formed of an elastic member and sealedly disposed within the glass container to be connected to the second electrode at one end thereof, and a third lead one end of which is sealedly disposed within the glass container to be connected to the second lead and the other end of which is led out from the glass container.

With the above first arrangement, since the leads for external connection and the semiconductor element are connected through the conductor having the bent structure, the semiconductor device can absorb a stress when undergoing a mechanical or thermal shock through the above bent structure, whereby the device can be highly reliable.

When the electrodes are formed to cover substantially all areas of the semiconductor chip in this way, the dielectric film can sufficiently exhibit its function as a capacitor and the bent portion can absorb a stress caused by a mechanical or thermal shock, whereby a stress applied to the dielectric film can be remarkably reduced compared with that of the prior art dielectric film. Accordingly, the dielectric film may be of any material that can satisfy conditions necessary as a capacitive element, thus improving selectivity of the material of the dielectric film.

With the second arrangement, since the leads for external connection and the semiconductor element are connected through the second extensible lead formed of the elastic member, the semiconductor device can absorb a stress when undergoing a mechanical or thermal shock through the bent structure, whereby the device can be highly reliable, as in the first arrangement.

Further, since the bent structure can absorb such a stress, a mechanical strength of the dielectric film can be made smaller than that of the prior art. Thus, while in the conventional device, a dielectric film must be of a two-layered film, i.e., a silicon oxide film and a silicon nitride film are layered to improve the strength, the dielectric film of the present invention can be of a single layer of a silicon oxide film, so that the strength dependency of the dielectric film is lessened.

Further, the invention is featured in that the first and third leads comprise each a Dumet wire. The Dumet wire is hard, has a thermal expansion coefficient close to that of the sealing glass material and a hermetical property, is effective for fixing of the silicon pellet and the second lead, and are sealed within the glass container in a highly sealed condition.

Furthermore, since the second lead is made of tungsten that is high in processability and stress absorbability, the second lead can have a good elastic and bent structure, whereby the dielectric film can be protected from stress destruction and therefore the resultant capacitive device can have a highly reliable structure.

In addition, since the first and second leads are connected to the electrodes through the silver-solder, this can protect the capacitive device from a positional offset of the second lead or the electrodes or dielectric film form being destructed when undergoing a drop shock. That is, the silver-solder has two functions of lead fixing and stress absorption. Since the silver-solder requires a low thermal step temperature during fabrication and is relatively soft, it has a high stress absorbability and a high element protectability.

BEST MODE FOR CARRYING OUT THE INVENTION

An embodiment of the present invention will be detailed with reference to the accompanying drawings.

Figure 1:
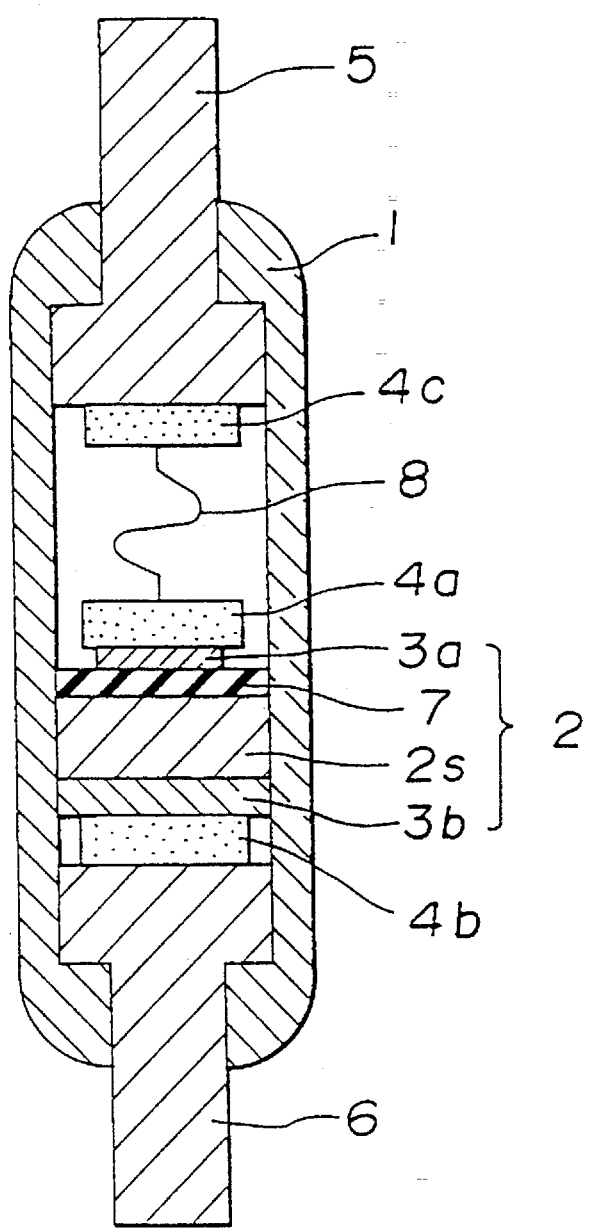
FIG. 1 shows a semiconductor device in accordance with an embodiment of the present invention.

FIG. 1 shows a semiconductor device in accordance with an embodiment of the present invention.

This semiconductor device is characterized in that, as shown in FIG. 1, a capacitive element 2 formed of a silicon chip is sealed within a cylindrical glass container 1 and a stress absorber in the form of an S-shaped tungsten wire 8 is connected between one of electrodes formed on both sides of a main body 2s of the capacitive element 2 and a lead 5 made of a Dumet wire through solder layers 4a and 4c.

Figure 3:
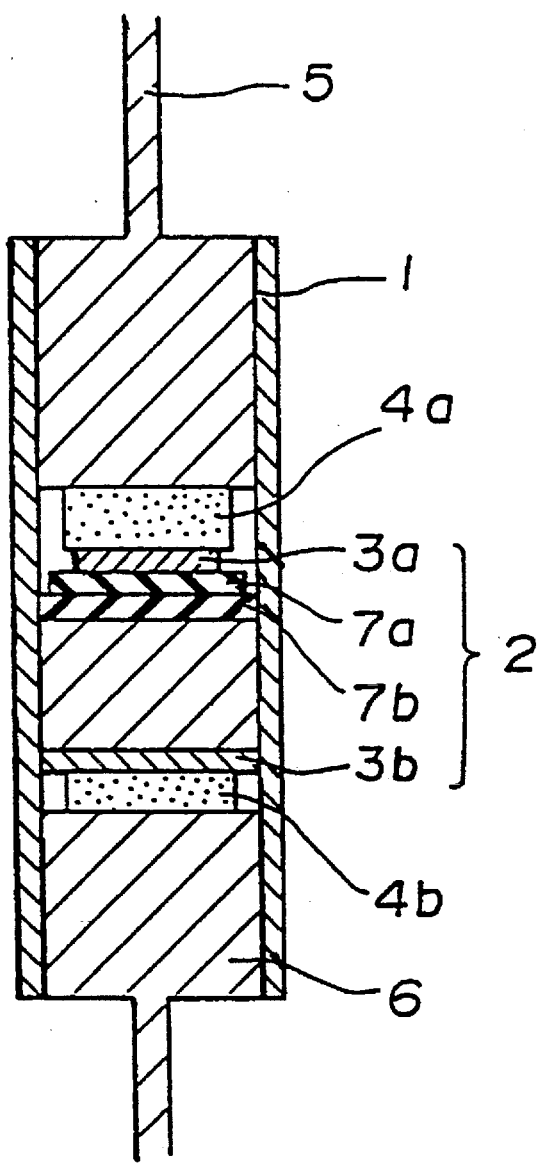
FIG. 3 shows a prior art semiconductor device.

Other parts are formed to have substantially the same structures as those of the prior art device of FIG. 3. From the electrodes 3a and 3b made of titanium-tungsten alloy, leads 5 and 6 are led through the solder layers 4a and 4b respectively. In the illustrated example, reference numeral 7 denotes a silicon oxide film as a dielectric film formed on a surface of the silicon substrate 2s. The electrode 3a is formed on the dielectric film. The "Dumet wire" used herein refers to such a cold-rolled steel material that is plated thereon with copper.

Next, explanation will be made as to a method of fabricating the above semiconductor device.

First, on a mirror surface of the silicon substrate 2s having a crystal face orientation (1 1 1) and an arsenic doping concentration of $5 \times 10^{19}$ cm$^{-3}$, a silicon oxide film of 100 nm thick is formed by a liquid phase growth process as a dielectric layer 7. On this layer 7, a titanium-tungsten alloy layer 3a of 50 nm thick is formed by a sputtering process and pattered into a 0.4 mm-square at its electrode by an ordinary photolithography and etching processes. Further, the silicon oxide film 7 is selectively removed by the photolithography and etching processes to form a groove of 40 μm wide as a dicing line. Then, a spontaneous oxide film formed on the rear side of the silicon substrate is removed and a silver-palladium layer 3b of 500 nm thick is formed on the rear surface of the silicon substrate by the sputtering process. Thereafter, the resultant substrate is cut along the dicing line with use of a dicing saw into a pellet of a 0.45 mm square to form a capacitive element (FIG. 2(a)).

Figure 2:
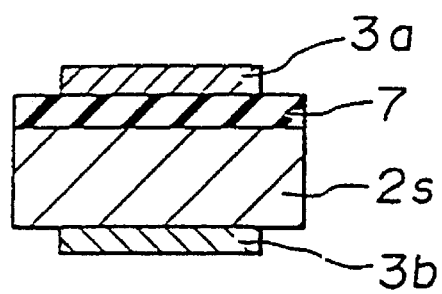
FIGS. 2a–c shows steps in a method of fabricating the semiconductor device of the embodiment of the invention.
Figure 2:
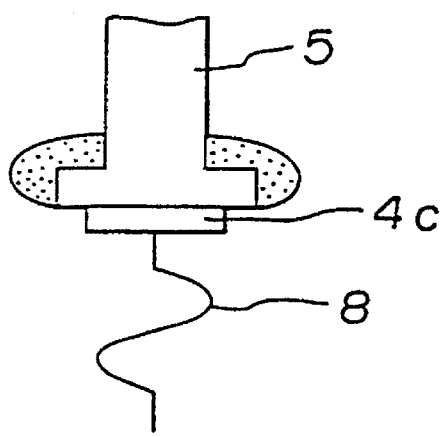
Figure 2:
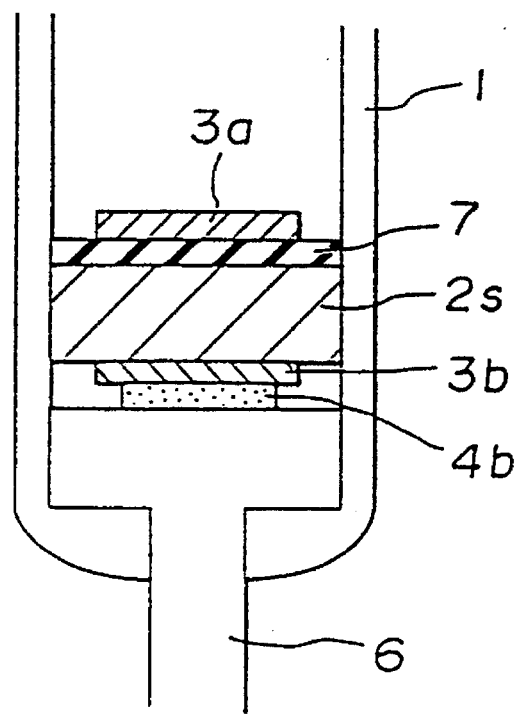

Subsequently, as shown in FIG. 2(b), the Dumet wire 5 and a glass bead (diode sealing glass manufactured by Nippon Denki Garasu K.K.) are heated and sealedly fused together, and subsequently the Dumet wire and the S-shaped tungsten wire 8 are heated and fusedly bonded together with a silver-solder pellet.

Further, the Dumet wire 6 and the glass bead are heated and fusedly bonded together and inserted into a cylindrical glass bulb 1. Then, the glass bead and glass bulb are heated and bonded together. The aforementioned capacitive element is inserted into the thus formed glass bulb 1 having the Dumet wire in such a manner that the silver-palladium electrode 3b is oriented toward the Dumet wire 6 via the silver solder pellet and heated and fusedly bonded at a temperature of 600°–800° C. (FIG. 2(c)).

Next, the above glass-bonded Dumet wire 5 is inserted into the glass container 1 in such a manner that a free end of the tungsten wire 8 faces the titanium-tungsten alloy electrode 3a of the capacitive element via the silver solder pellet, and then heated and sealedly bonded together at a temperature of 600°–800° C., at which stage such a glass seal type capacitive element as shown in FIG. 1 is prepared.

It is desirable that the final sealing and fusion bonding operation is carried out in a dry atmosphere so that the interior space of the glass container is of a dry air or nitrogen atmosphere.

The glass seal type capacitive element thus prepared had a capacitance of 48 pF. The device exhibited a breakdown voltage of 20 V or more and a yield that was improved by 70% or more over the prior art glass seal type capacitive element of FIG. 3 having a yield of about 3%. This is considered due to the fact that the S-shaped tungsten wire can effectively absorb the thermal distortion/stress caused by the thermal expansion coefficient difference and thus can prevent the dielectric deterioration and destruction of the capacitive element. Further, since the tungsten wire can also absorb a mechanical stress, the capacitive device is strong when subjected to a shock.

Although the tungsten wire as a stress absorber has been made in the form of an S shape bend, any shape including a spiral can be employed so long as the shape can provide a spring action. In this connection, the smaller the spring constant of a spring is the more largely the stress of the device caused by its expansion/shrinkage can be reduced.

Further, the crystal face orientation of the silicon substrate employed in the capacitive element is not limited to the above (1 1 1) but may be (1 1 0), (5 1 1) or any orientation. Furthermore, the doping impurity is not restricted to arsenic but boron, antimony, phosphorus or similar element may be employed. In the latter case, it is desirable that the doping concentration is set to be within such a range that the capacitance has not a voltage dependency, e.g., to be above $5 \times 10^{18}$ cm$^{-3}$.

The insulating film may be made of not only silicon oxide but also titanium oxide or other suitable material. And the insulating film has a thickness of desirably from about 10 nm to 10 μm. The preparation method can include any processes such as a thermal oxidation process, a direct nitriding process, a CVD process, a PVD process, a spin-on glass process, a liquid phase growth process and any other process. Among these processes, in particular, the spin-on glass and liquid phase growth processes are effective for a soft film.

In addition, although explanation has been made as to the capacitive element in the foregoing embodiment, it goes without saying that the present invention is not restricted to the capacitive element but may be applied to other semiconductor elements.

INDUSTRIAL APPLICABILITY

As has been explained in the foregoing, in accordance with the present invention, there can be obtained such a glass seal type semiconductor device that is high in manufacturing yield and resistive to heat and shock.

I claim:

1. A semiconductor device comprising:

a cylindrical glass container;

a semiconductor chip sealedly provided within said glass container and forming a capacitive element of an MIS structure;

first and second electrodes of titanium-tungsten formed to cover substantially all areas of front and rear surfaces of said semiconductor chip;

a first lead, one end of which is sealedly disposed within said glass container to be connected to said first electrode and the other end of which is led out from said glass container;

a second lead having multiple bent portions and sealedly disposed within said glass container to be connected to said second electrode at one end thereof; and a third lead, one end of which is sealedly disposed within said glass container to be connected to said second lead and other end of which is led out of said glass container.

2. A semiconductor device as set forth in claim 1, wherein said second lead is a wire having an S-shaped bent portion.

3. A semiconductor device comprising:

a cylindrical glass container;

a semiconductor chip sealedly provided within said glass container and forming a capacitive element of an MIS structure;

first and second electrodes of titanium-tungsten alloy formed to cover substantially all areas of front and rear surfaces of said semiconductor chip;

a first lead, one end of which is sealedly disposed within said glass container to be connected to said first electrode and the other end of which is led out from said glass container;

a second lead having an S-shaped bent portion sealedly disposed within said glass container to be connected to said second electrode at one end thereof, wherein said second lead is a tungsten wire; and a third lead one end of which is sealedly disposed within said glass container to be connected to said second lead and the other end of which is led out of said glass container, wherein said first and third leads are Dumet wires.

4. A semiconductor device as set forth in claim 3, wherein said first and second leads are connected through silver-solder layers formed to cover substantially all areas of said first and second electrodes.

5. A semiconductor device comprising:

a cylindrical glass container;

a semiconductor chip sealedly provided within said glass container and forming a capacitive element of an MIS structure;

first and second electrodes of titanium-tungsten alloy formed to cover substantially all areas of front and rear surfaces of said semiconductor chip;

a first lead one end of which is sealedly disposed within said glass container to be connected to said first electrode and the other end of which is led out from said glass container;

a second extensible lead formed of an elastic member and sealedly disposed within said glass container to be connected to said second electrode at one end thereof; and a third lead one end of which is sealedly disposed within said glass container to be connected to said second lead and the other end of which is led out from said glass container.

6. A semiconductor device as set forth in claim 5, wherein said second lead is a tungsten wire having an S-shaped bent portion.

7. A semiconductor device as set forth in claim 6, wherein said first and third leads are Dumet wires.

8. A semiconductor device as set forth in claim 7, wherein said first and second leads are connected through silver-solder layers formed to cover said first and second electrodes.

* * * * *